(12) United States Patent
Miller et al.

(10) Patent No.: US 11,368,783 B2
(45) Date of Patent: Jun. 21, 2022

(54) PREVENTION OF BUZZ NOISE IN SMART MICROPHONES

(71) Applicant: Knowles Electronics, LLC, Itasca, IL (US)

(72) Inventors: Thomas E. Miller, Itasca, IL (US); Andrew D. Unruh, San Jose, CA (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/846,123

(22) Filed: Apr. 10, 2020

(65) Prior Publication Data

US 2020/0329299 A1 Oct. 15, 2020

Related U.S. Application Data

(60) Provisional application No. 62/833,616, filed on Apr. 12, 2019.

(51) Int. Cl.
*H04R 1/10* (2006.01)
*B81B 3/00* (2006.01)
*H04R 1/22* (2006.01)

(52) U.S. Cl.
CPC ......... *H04R 1/1083* (2013.01); *B81B 3/0078* (2013.01); *H04R 1/222* (2013.01); *B81B 2201/0257* (2013.01); *H04R 2201/003* (2013.01)

(58) Field of Classification Search
CPC ........ H04R 19/005; H04R 19/04; H04R 1/04; H04R 2201/003; H04R 23/00; H04R 23/006; H04R 3/00; H04R 3/06; H04R 1/08; H04R 31/00; H04R 1/021; H04R 1/086; H04R 1/1041; H04R 1/1083; H04R 1/14; H04R 1/222; H04R 1/46; H04R 2201/023; H04R 2201/107; H04R 2410/03; H04R 2499/11; H04R 31/006; G10L 25/78; H04B 1/3833; H04M 1/026; H04M 1/72454

(Continued)

(56) References Cited

U.S. PATENT DOCUMENTS

2005/0278044 A1* 12/2005 Chen ................. G10H 7/004
700/94
2014/0337036 A1* 11/2014 Haiut ................. G10L 15/20
704/275

(Continued)

FOREIGN PATENT DOCUMENTS

WO    WO 2011/022027    *    2/2011    ............... F02G 5/02

*Primary Examiner* — Lun-See Lao
(74) *Attorney, Agent, or Firm* — Loppnow & Chapa; Matthew C. Loppnow; Roland K. Bowler, II

(57) ABSTRACT

A microphone device includes a substrate having a first surface, a wall disposed on the first surface, a microelectromechanical systems (MEMS) transducer, and an integrated circuit. Both the MEMS transducer and the integrated circuit are mounted on the first surface of the wall. The wall separates the MEMS transducer from the integrated circuit and acoustically isolates the MEMS transducer from the integrated circuit. The microphone device additionally includes a first set of wires extending through the wall and electrically connecting the MEMS transducer to the integrated circuit. The microphone device further includes a second set of wires electrically connecting the integrated circuit to a conductor on the substrate.

20 Claims, 10 Drawing Sheets

(58) Field of Classification Search
USPC .......... 381/71.1–71.6, 94.1–94.5, 92; 700/94
See application file for complete search history.

(56) References Cited

U.S. PATENT DOCUMENTS

| | | | | |
|---|---|---|---|---|
| 2015/0131820 | A1* | 5/2015 | Veneri | H04R 19/005 |
| | | | | 381/174 |
| 2017/0240418 | A1* | 8/2017 | Qutub | B81C 1/00269 |
| 2017/0339494 | A1* | 11/2017 | Perletti | H04R 19/005 |
| 2018/0150031 | A1* | 5/2018 | Caffee | G01K 7/01 |
| 2018/0346322 | A1* | 12/2018 | Sakuragi | B81C 1/00047 |
| 2020/0125334 | A1* | 4/2020 | Rub | H04R 19/005 |
| 2021/0345034 | A1* | 11/2021 | Usher | G01H 3/00 |

* cited by examiner

PREVENTION OF BUZZ NOISE IN SMART MICROPHONES

FIELD OF THE DISCLOSURE

The present disclosure relates to microphone devices and more particularly to microphone devices having temperature induced noise mitigation, electrical circuits and method therefor.

BACKGROUND

Microphone devices including a MEMS acoustic transducer and an integrated circuit disposed in a housing are known generally. Some microphone devices also include a digital signal processing circuit (DSP) contained within the same housing as the MEMS acoustic transducer. The integrated circuit or DSP processes the electrical signal from the MEMS acoustic transducer to generate an output signal indicative of the sensed acoustic activity. Such microphone devices may be employed in mobile communication devices, laptop computers, and appliances, among other devices and machinery.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

DETAILED DESCRIPTION

Figure 1:
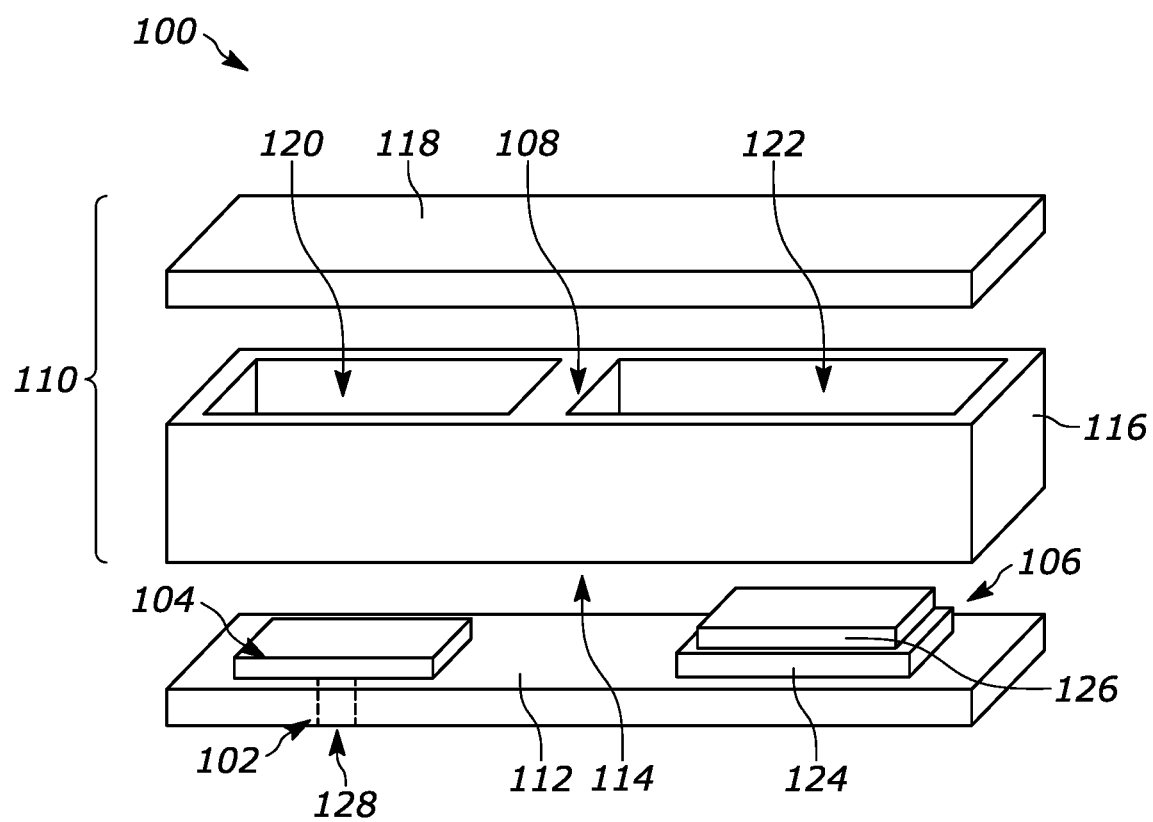
FIG. 1 is an exploded view of a microphone device, according to an illustrative embodiment.

The present disclosure describes methods and devices for improving the acoustic isolation of a microelectromechanical systems (MEMS) capacitive acoustic transducer within a microphone device. In particular, methods and devices are described for reducing thermo-acoustic effects associated with operation of an integrated circuit (IC) that is disposed near the MEMS transducer. The MEMS transducer converts sound (e.g., pressure waves) into an electrical signal, and outputs the electrical signal to the IC. The IC receives the electrical signal and generates an output audio signal for the microphone device. The processing operations performed by the IC generate heat, which can cause the air pressure to fluctuate in the vicinity of the MEMS transducer. These pressure fluctuations are captured by the MEMS transducer and result in noise in the output audio signal from the microphone device. In some implementations of the present disclosure, the microphone device includes a wall that separates the MEMS transducer from the IC in order to insulate the air surrounding the MEMS transducer and thereby reduce these thermo-acoustic effects. The microphone device may additionally implement a feedforward noise cancelation technique or filtering technique to reduce the noise in the output audio signal. Among other benefits, using a noise cancelation technique allows for the reduction of noise without having to modify the enclosed-back volume of the microphone device.

In various illustrative embodiments, the microphone device includes a substrate, a MEMS transducer, and an IC. The MEMS transducer and the IC are mounted on a first surface of the substrate. The microphone device additionally includes a wall disposed on the first surface that separates the MEMS transducer from the IC in order to acoustically isolate the MEMS transducer from the IC. The wall may form at least part of an airtight seal between the MEMS transducer and the IC. In some implementations, the wall may include a low thermal conductivity material in order to reduce heat transfer through the wall between the MEMS transducer and the IC.

In some embodiments, the microphone device may implement at least one thermo-acoustic noise cancelation technique. The technique may include measuring a reference signal based on at least one of a current through the IC, a temperature of the IC, or a command performed by the IC.

The technique may additionally include filtering the reference signal based on a heat-to-sound conversion process and removing the filtered reference signal from an electrical signal produced by the MEMS transducer. In other embodiments, the technique may include generating, by an electrical oscillator, an oscillator signal based on a frame rate of noise generated by the IC. In some implementations, a frequency of the oscillator signal may be approximately equal to an integer multiple of the frame rate. The technique may include combining the oscillator signal with the electrical signal to reduce noise in the output audio signal. The details of the various depictions provided above will be more fully explained by reference to FIGS. 1-18.

FIG. 1 depicts an exploded view of a first example microphone device 100. The first example microphone device 100 includes a substrate 102, a microelectromechanical systems (MEMS) transducer 104, an integrated circuit (IC) 106, a wall 108, and a cover 110. The MEMS transducer 104 and the IC 106 are disposed on a first surface 112 of the substrate 102 (on one side of the substrate). The cover 110 can be mounted on the substrate 102 (e.g., on the first surface of the substrate) to enclose and protect the MEMS transducer 104, the IC 106, and any bonding wires (not shown) that electrically connect these components. The cover 110 can include materials such as plastic or metal. The cover 110 may include multiple pieces or be formed as a single unitary structure. As shown in FIG. 1, the cover 110 includes a middle housing 116 and a top piece 118. The wall 108 is integrally formed with the middle housing 116 as a single unitary structure. Together, the cover 110 and the substrate 102 define an enclosed back-volume, shown as enclosed volume 114 within which the MEMS transducer 104 and the IC 106 are disposed.

In the embodiment of FIG. 1, the enclosed volume 114 is hermetically sealed from an environment surrounding the microphone device 100. The cover 110 can be bonded to the substrate 102 using solder, an adhesive (e.g., epoxy), or the like. In some embodiments, the cover 110 is metalized to provide electromagnetic and optical shielding of the MEMS transducer 104 and the IC 106. For example, the cover 110 may be made at least partially from a circuit board material. At least portions of the connecting areas between the middle housing 116 and the substrate 102, and between the middle housing 116 and the top piece 118, are conductive in order to provide electrical continuity needed to achieve effective electromagnetic shielding. For example, the connections to the middle housing 116 may be made using solder or a conductive adhesive product.

As shown in FIG. 1, the wall 108 separates the enclosed volume 114 into two cavities, a first cavity 120 containing a pocket of air above the MEMS transducer 104, and a second cavity 122 containing a pocket of air above the IC 106. In various illustrative embodiments, the wall 108 forms an airtight seal between the MEMS transducer 104 and the IC 106. Among other benefits, the wall 108 acoustically isolates the first cavity 120 from the second cavity 122, thereby reducing thermo-acoustic noise in the output audio signal from the microphone device 100.

In various illustrative embodiments, the MEMS transducer 104 is a MEMS capacitive acoustic transducer that includes a conductive diaphragm spaced apart from a conductive back plate. The diaphragm is configured to move in relation to the back plate in response to incident acoustic energy (e.g., air pressure fluctuations, sound, etc.). The movement of the diaphragm in relation to the back plate causes a capacitance associated with the MEMS transducer 104 to vary. The change in the capacitance of the MEMS transducer 104 in response to the acoustic energy can be measured and converted into a corresponding electrical signal by the MEMS transducer 104.

The IC 106 can include a package that encloses analog and/or digital circuitry for processing electrical signals received from the MEMS transducer 104. The IC 106 can be an integrated circuit package having a plurality of pins or bonding pads that facilitate electrical connectivity to components outside of the IC 106 via wires. The analog or digital circuitry can include amplifiers, filters, analog-to-digital converters, digital signal processor, and other electrical circuitry for processing the electrical signals received from the MEMS transducer 104 and other components of the microphone device 100. In some embodiments, the IC 106 includes an application specific integrated circuit (ASIC), shown as ASIC 124. The ASIC 124 may include an analog chip dedicated to buffering the electrical signal from the MEMS transducer 104. In some embodiments, the IC 106 additionally includes a semiconductor die integrating various analog, analog-to-digital, and digital circuits disclosed herein. The electrical circuit also includes a digital signal processor (DSP), shown as DSP 126. The DSP 126 may be a discrete device or it may be integrated with the ASIC 124. The ASIC 124 and DSP 126 are shown stacked in FIG. 1, with the DSP 126 disposed on an upper surface of the ASIC 124. In other embodiments, the ASIC 124 and the DSP 126 may be positioned side-by-side or in another suitable arrangement. In some implementations, the DSP 126 is configured to control the operation of a command and control interface connectable to a processor of a host device, e.g. a portable, communication device, smartphone, etc. The DSP 126 may include a communication interface compliant with, and connected to, an externally accessible communication interface of the microphone device 100. The communication interface may include a proprietary or standardized data interface, such as SoundWire, SPI or PDM among other known or future data interfaces. The command and control interface may include a proprietary or standardized interface such as I²C, USB, UART or SoundWire among other known or future interfaces. While the illustrated implementation includes both the ASIC 124 and the DSP 126, it should be understood that some implementations may include only one (e.g., only the ASIC 124), and such implementations are contemplated within the scope of the present disclosure, including any of the various embodiments described herein with respect to both an ASIC and a DSP.

As shown in FIG. 1, the IC 106 is sized and shaped for mounting on the substrate 102. The substrate 102 likewise supports the MEMS transducer 104 and the DSP 126. In other embodiments, the MEMS transducer 104 may be mounted on the cover 110 (e.g., on the top piece 118). The IC 106 may be partially or fully embedded in the substrate or disposed in some other location within the enclosed volume 114.

The substrate 102 can include, without limitation, a printed circuit board, a semiconductor substrate, or a combination thereof. A portion of the substrate 102 adjacent to the MEMS transducer 104 defines a through-hole that forms a port 128 for the microphone device 100. Acoustic signals enter the microphone device 100 through the port 128, and cause the displacement of the diaphragm on the MEMS transducer 104. The microphone device 100 may additionally include a pair of bonding wires (e.g., a first set of bonding wires) to electrically connect the MEMS transducer 104 to the IC 106 and another pair of bonding wires (e.g., a second set of bonding wires) to electrically connect the IC 106 to the substrate 102. The substrate 102 may include electrical wire traces embedded within the substrate 102 to electrically connect the microphone device 100 with external circuitry (not shown). While various embodiments illustrated in the figures illustrate wires connecting the MEMS transducer and the IC traveling through walls between the components, it should be understood that, unless otherwise indicated, the MEMS transducer and IC can be communicatively coupled in other manners, such as by providing conductive traces disposed on and/or embedded within layers of the substrate 102. All such embodiments are contemplated within the scope of the present disclosure.

The wall 108 of the microphone device 100 may include a slot or aperture that is configured to receive bonding wires therein in order to electrically connect the MEMS transducer 104 to the IC 106. For example, the wall 108 may include a broad slot (not shown) forming a recessed area in an upper surface of the wall 108 (e.g., an upper surface of the middle housing 116). After the wires are attached to the MEMS transducer 104 and the IC 106, a sheet of conductive adhesive may be placed on top of the wires, filling the slot. The top piece 118 may be coupled to the middle housing 116, also using conductive adhesive, in order to seal the enclosed volume 114 from the environment surrounding the microphone device 100 and to acoustically isolate the first cavity 120 from the second cavity 122.

Figure 2:
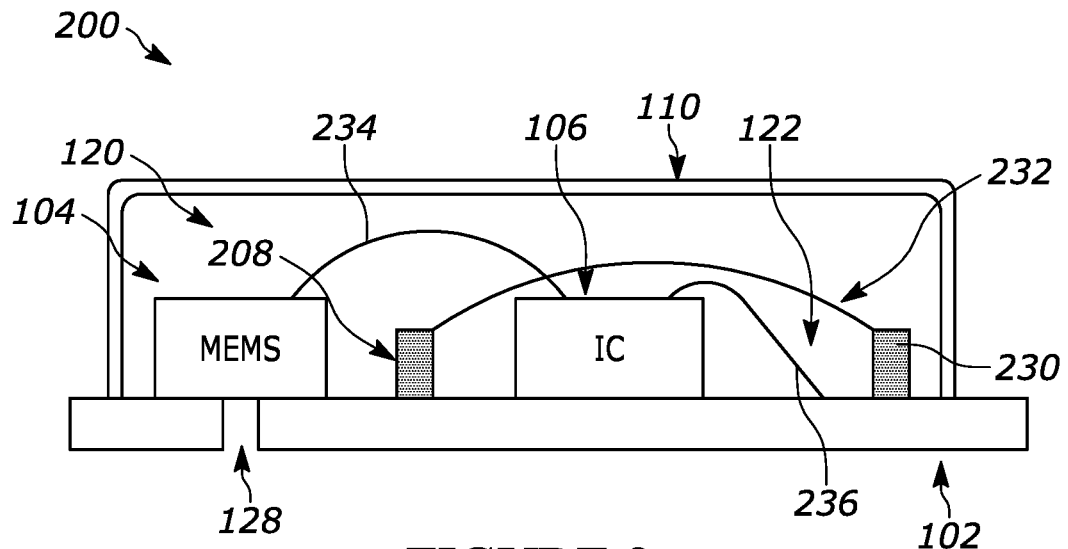
FIG. 2 is a side cross-sectional view of a microphone device including an integrated circuit that is fully covered in insulating material, according to an illustrative embodiment.
Figure 3:
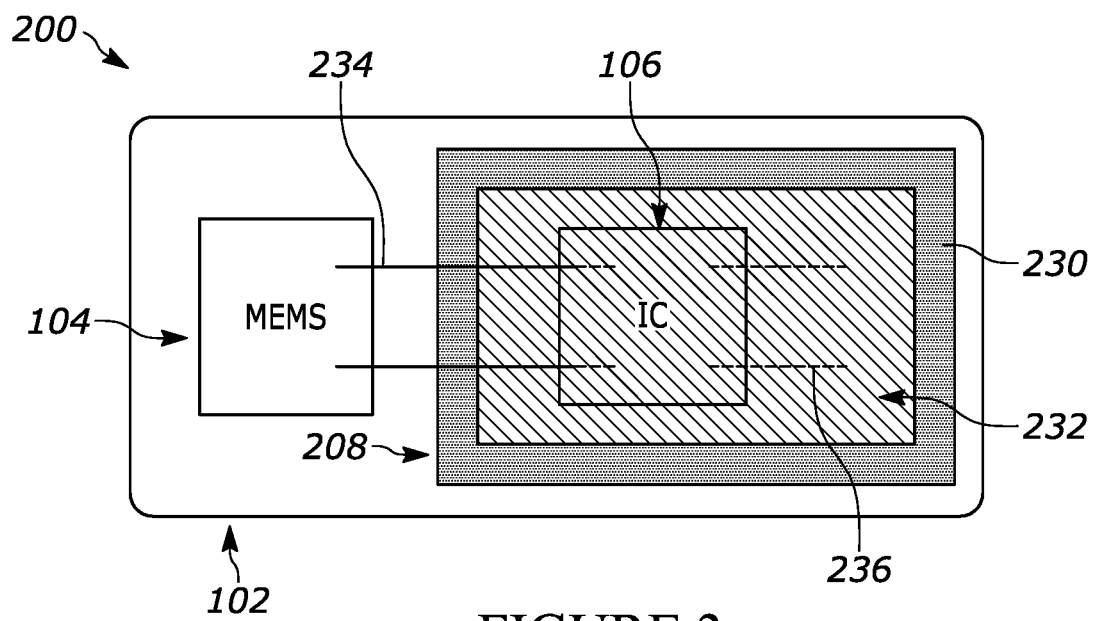
FIG. 3 is a top cross-sectional view of the microphone device of FIG. 2.

FIGS. 2 and 3 depict a cross-sectional view and a top view, respectively, of a second example microphone device 200. Several elements of the second example microphone device 200 of FIGS. 2 and 3 are similar to the components of the first example microphone device 100 of FIG. 1. To that extent, the similar elements have been labeled with similar reference numbers. In various example embodiments, the microphone device 200 may be the same or similar to at least one of the example microphone devices presented in U.S. patent application Ser. No. 15/988,983, filed May 24, 2018, the entire disclosure of which is incorporated by reference herein.

As shown in FIGS. 2 and 3, the microphone device 200 includes a wall 208 that separates the MEMS transducer 104 from the integrated circuit (IC) 106. The wall 208 includes a platform 230 and an encapsulating material 232. The platform 230 extends from (e.g., rises above) the first surface 112 of the substrate 102 and surrounds the IC 106. The platform 230 at least partially defines the second cavity 122 within which the IC 106 is contained. A height of the platform 230, perpendicular to the surface of the substrate 102 on which the platform 230 is mounted, is less than a height of the IC 106. In some embodiments, the height of the platform 230 may be equal to or greater than the height of the IC 106; for example, the height of the platform 230 may be equal to a height of the enclosed volume between the substrate 102 and the cover 110. While the present embodiment is discussed with reference to the IC 106 as a whole, it should be understood that, in some embodiments, the IC 106 may include only the ASIC 124, only the DSP 126, or both the ASIC 124 and the DSP 126.

As shown in FIGS. 2 and 3, the microphone device 200 includes a first set of wires 234 (e.g., bonding wires) that electrically connect the MEMS transducer 104 to the IC 106, and a second set of wires 236 that electrically connect the IC 106 to the substrate 102. The encapsulating material 232 completely covers the ASIC 124 and a second set of wires 236. The encapsulating material 232 insulates the ASIC 124, thereby reducing heat transfer from the ASIC 124 to the first cavity 120 (e.g., into the pocket of air above the MEMS transducer 104). The encapsulating material 232 also covers a portion of the first set of wires 234, a distance from the IC 106, and forms an airtight seal around the covered portion of the first set of wires 234.

Figure 4:
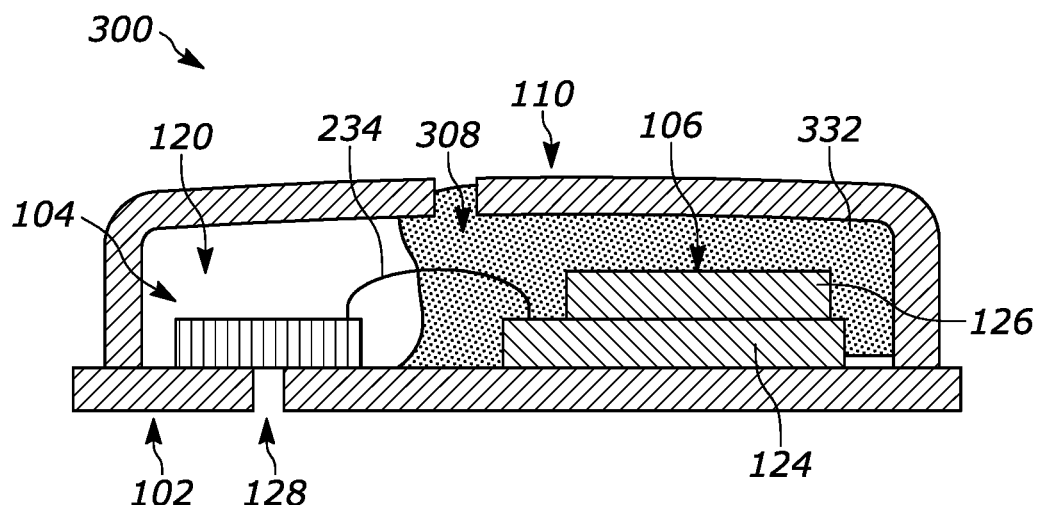
FIG. 4 is a side cross-sectional view of a microphone device including an integrated circuit fully covered in an insulating material, according to an illustrative embodiment.

FIG. 4 depicts a side cross-sectional view of a third example microphone device 300. Like the second example microphone device 200 of FIGS. 2 and 3, the third example microphone device 300 of FIG. 4 includes a wall 308 that includes an encapsulating material 332. The encapsulating material 332 completely surrounds the IC 106. Additionally, the encapsulating material 332 completely fills an area between the substrate 102 and the cover 110 proximate to the IC 106 (e.g., analogous to the second cavity 122 shown in FIG. 1).

Figure 5:
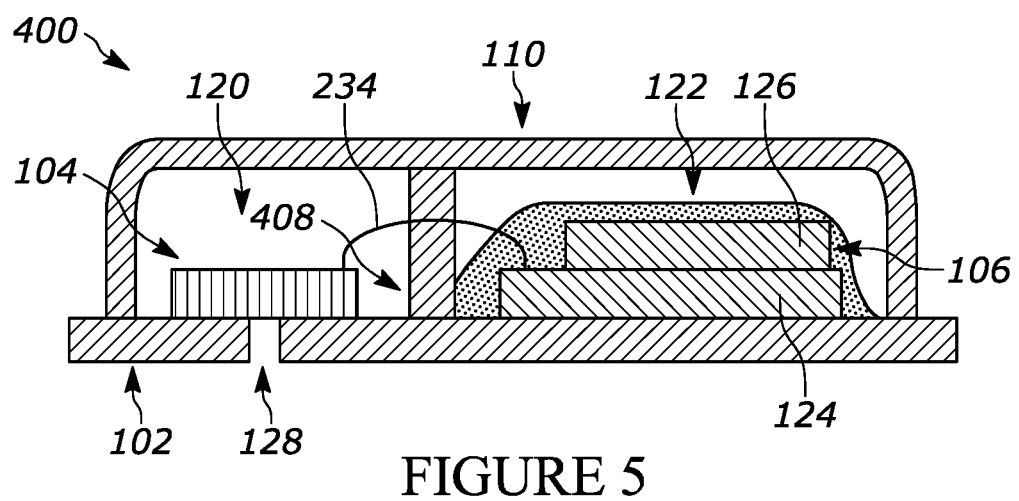
FIG. 5 is a side cross-sectional view of a microphone device including a vertical wall, according to an illustrative embodiment.

FIG. 5 depicts a side cross-sectional view of a fourth example microphone device 400. The microphone device 400 includes a wall 408 in substantially perpendicular orientation relative to the substrate 102. The wall 408 may be made from an insulating material (e.g., a material with low thermal conductivity) such as glass reinforced epoxy laminate (e.g., FR-4) or another epoxy. In some embodiments, the wall 408 is applied to the substrate 102 in a partially-cured semi-rigid form (i.e., B-stage epoxy), which, advantageously, helps to ensure an airtight seal between the wall 408 and the substrate 102 (and/or cover 110). Alternatively, or in combination, the wall 408 may be coupled to the substrate 102 using solder or an adhesive product. In some embodiments, the microphone device 400 includes a compliant gasket material (e.g., rubber, etc.) to seal the wall 408 to at least one of the substrate 102 or the cover 110.

As shown in FIG. 5, the first set of wires 234 extend through the wall 408 at an intermediate position along the wall 408 between the substrate 102 and the cover 110. In other embodiments, the first set of wires 234 may extend through another position along the wall 408. In yet other embodiments, the wires may connect the components in another suitable manner, such as through electrical traces between the MEMS transducer 104 and the IC 106 (e.g., electrical traces embedded in the substrate 102). The first set of wires 234 may penetrate the wall 408 through a slot, notch, aperture, or another suitable opening in the wall 408. The opening may be sealed with an adhesive product (e.g., glue or epoxy); for example, the opening may be sealed with B-stage epoxy, which, when hardened, provides an airtight seal between the first cavity 120 and the second cavity 122. As with the first example microphone device 100 (of FIG. 1), the wall 408 in the fourth example microphone device 400 prevents pressure fluctuations of the air pocket in the second cavity 122 from causing a change in air pressure in the first cavity 120 above the MEMS transducer 104. The air pocket in the second cavity 122, between the wall 408 and the IC 106, further insulates the IC 106 to prevent heat transfer from the IC 106 to the wall 408.

Figure 6:
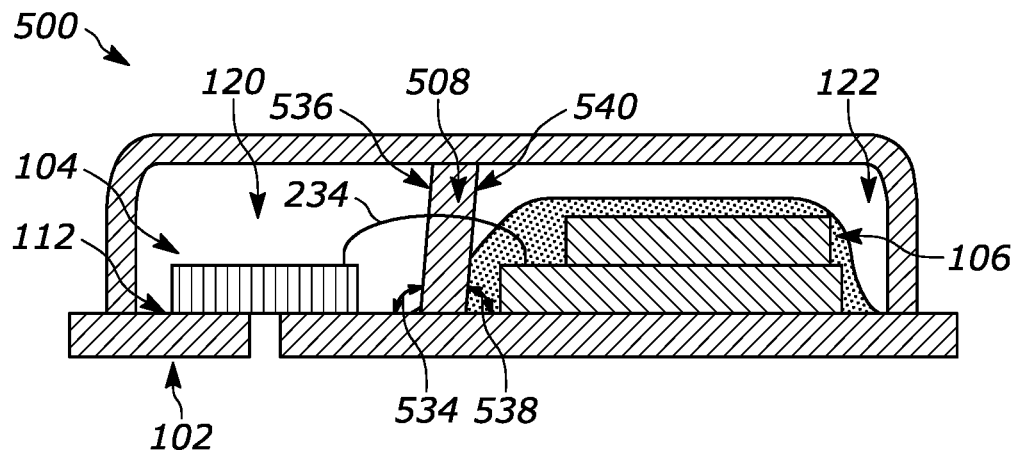
FIG. 6 is a side cross-sectional view of a microphone device including an angled wall, according to an illustrative embodiment.

The orientation of the wall 408 relative to the substrate 102 and/or cover 110 may differ in various illustrative embodiments. For example, FIG. 6 depicts a fifth example microphone device 500 including a wall 508 that is angled (e.g., tilted, leaning, etc.) toward the second cavity 122. In other words, a first angle 534, between a first side 536 of the wall 508 and the first surface 112 is greater than a second angle 538 between a second side 540 of the wall 508 (e.g., an opposite side of the wall 508 as the first side 536) and the first surface 112. Among other benefits, angling the wall 508 toward the second cavity 122 (e.g., the IC 106) increases a volume of air in the first cavity 120, which can improve the acoustic performance of the MEMS transducer 104.

Figure 7:
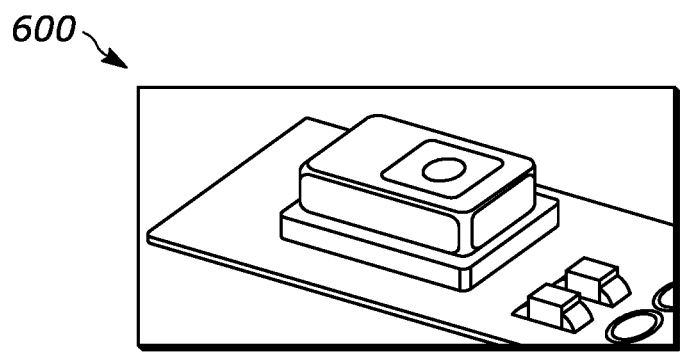
FIG. 7 is a perspective view of a microphone device including a vent hole, according to an illustrative embodiment.
Figure 8:
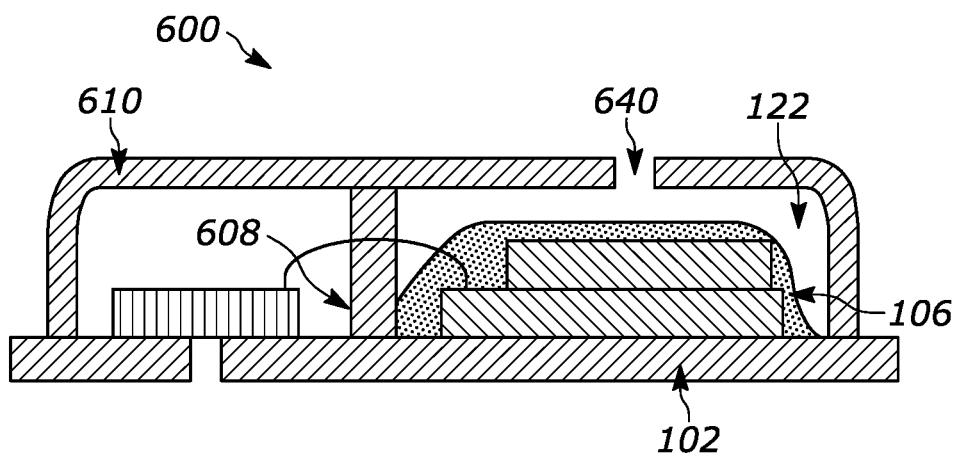
FIG. 8 is a side cross-sectional view of the microphone device of FIG. 7.

Additional features may be incorporated into the microphone device to improve acoustic isolation between the cavities 120, 122. For example, FIGS. 7 and 8 depict a sixth example microphone device 600 according to embodiments of the present disclosure. As shown, the microphone device 600 is similar to the fourth example microphone device 400 of FIG. 5. The microphone device 600 additionally includes a vent hole, shown as vent 640 disposed in a cover 610 of the microphone device 600. The vent 640 may be an opening, hole, or slot extending through the cover 610. The vent 640 could be formed into the cover 610 via a punching operation, a laser machining operation, or another suitable forming operation. In some implementations, the vent 640 is formed in the substrate 102 and/or at a connection point between the cover 610 and the substrate 102; for example, the vent 640 may be formed by having an incomplete seal between the cover 610 and the substrate 102. The vent 640 allows for the expansion and contraction of air within the second cavity 122 at approximately constant pressure, which, advantageously, prevents the wall 608 from bending or vibrating in response to pressure fluctuations in the second cavity 122 (e.g., in the air pocket surrounding the IC 106).

Figure 9:
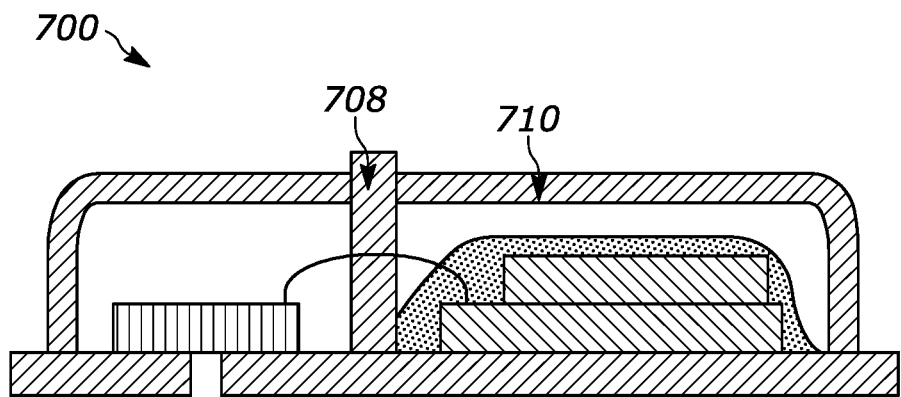
FIG. 9 is a side cross-sectional view of a microphone device that includes a wall that is inserted through a cover of the microphone device, according to an illustrative embodiment.

It will be appreciated that the design and arrangement of components within the microphone assembly may be modified without departing from the inventive concepts disclosed herein. FIG. 9 shows a seventh example microphone device 700 including a wall 708 that extends through a cover 710 of the microphone device 700. The wall 708 may fully separate the cover 710 into two or more pieces. Alternatively, the wall 708 may be inserted through a slot extending along at least a portion of the top or the side of the cover in order to simplify manufacturing of the microphone device 700.

Figure 10:
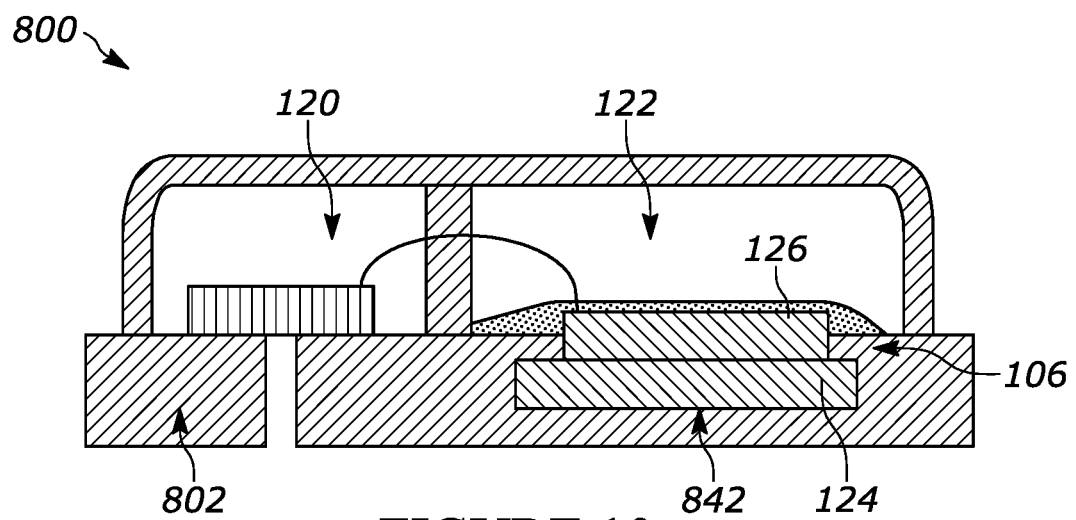
FIG. 10 is a side cross-sectional view of a microphone device including an integrated circuit that is at least partially embedded in a transducer substrate, according to an illustrative embodiment.

FIG. 10 depicts an eighth example microphone device 800. As shown in FIG. 10, the microphone device 800 includes a substrate 802 having a recessed portion 842. The IC 106 is at least partially embedded into the substrate 802 at the recessed portion 842 such that only a portion of the IC 106 protrudes into the second cavity 122. In the embodiment of FIG. 10, the ASIC 124 is fully embedded within the substrate 802. The DSP 126 is partially embedded within the substrate 802. In some embodiments, the IC 106 may be thermally coupled to the substrate 102 via a conductive adhesive. The substrate 802 material, and the conductive traces disposed within the substrate 802, divert heat produced by the IC 106 away from the second cavity 122, thereby reducing overall heat transfer from the IC 106 to the first cavity 120.

Figure 11:
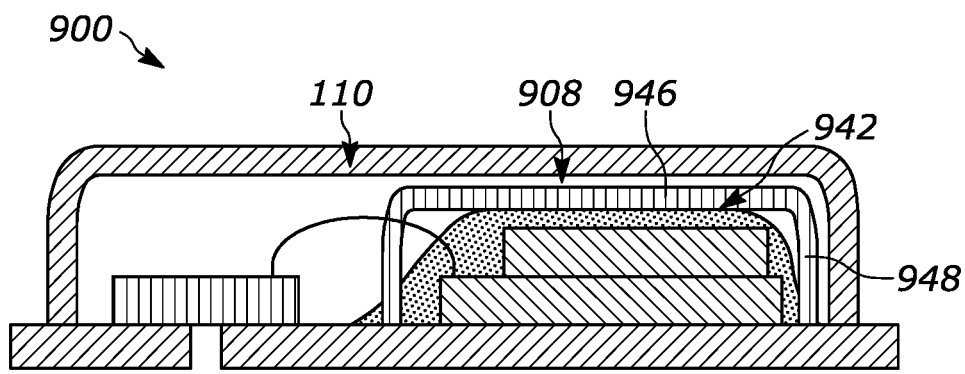
FIG. 11 is a side cross-sectional view of a microphone device including a five-walled lid isolating an integrated circuit, according to an illustrative embodiment.
Figure 12:
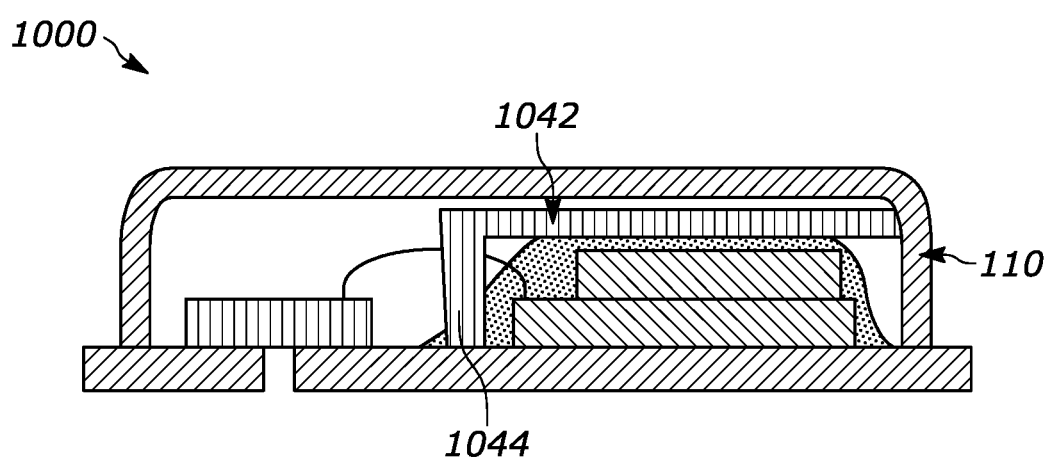
FIG. 12 is a side cross-sectional view of a microphone device including a four-walled lid isolating an integrated circuit, according to an illustrative embodiment.

The shape of the wall between the first and second cavities may also differ in various illustrative embodiments. FIG. 11 depicts a ninth example microphone device 900. The microphone device 900 includes a wall 908 that completely covers the IC 106. The wall 908 includes a lid 942 including a plurality of sides. In the embodiment of FIG. 11, the lid 942 includes five sides including a horizontal (e.g. upper) side 946 and four vertical sides 948 in substantially perpendicular orientation relative to the horizontal side 946 (e.g., substantially vertical as shown in FIG. 11). Together, the horizontal size 946 and the four vertical sides 948 define a cup shape. The lid 942 may be substantially the same shape as the cover 110 or another suitable shape. The number of sides 944 of the lid 942 may be different in various example embodiments. FIG. 12 depicts a tenth example microphone device 1000 that includes a lid 1042 having four sides 1044 (e.g., a horizontal or upper side and three vertical sides extending normal to the horizontal side). The lid 1042 is engaged with and coupled to the cover 110 in order to acoustically isolate the cavities 120, 122 from one another.

Figure 13:
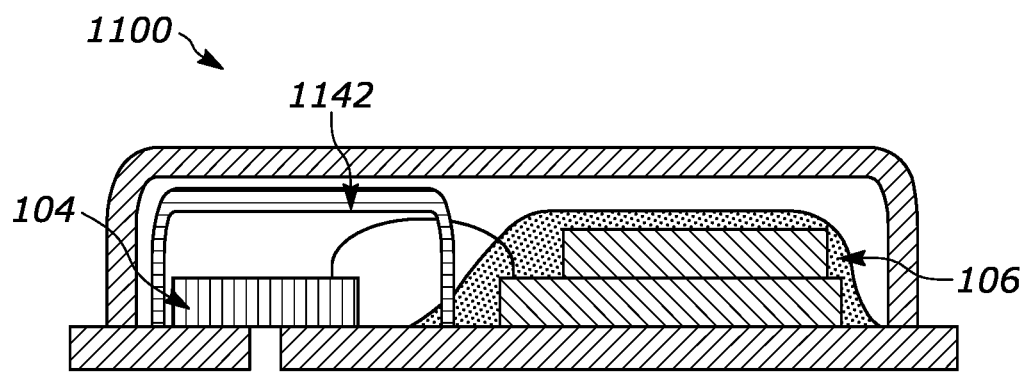
FIG. 13 is a side cross-sectional view of a microphone device including a five-walled lid isolating a MEMS transducer, according to an illustrative embodiment.
Figure 14:
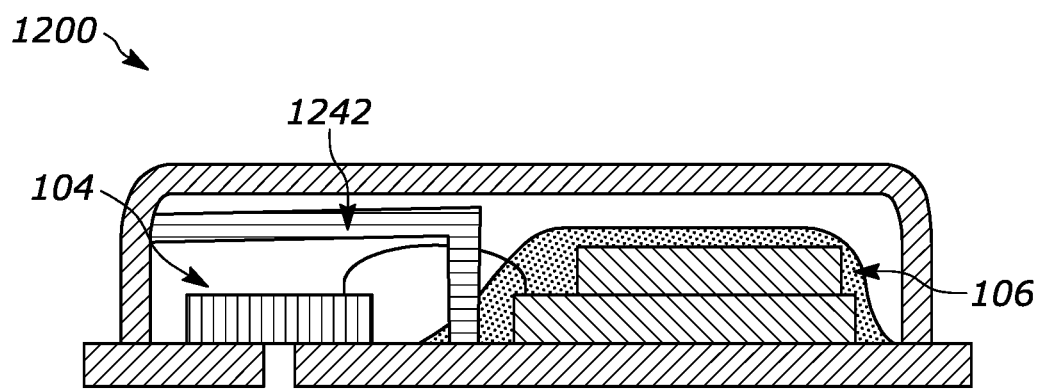
FIG. 14 is a side cross-sectional view of a microphone device including a four-walled lid isolating a MEMS transducer, according to an illustrative embodiment.

FIGS. 13 and 14 depict example microphone devices 1100, 1200 that include a lid 1142, 1242 positioned over MEMS transducer 104 instead of the IC 106.

Another aspect of the present disclosure is a filtering technique used to reduce thermo-acoustic noise in the output audio signal generated by a microphone device. It should be understood that, in various embodiments, the mechanical and electrical techniques presented herein to reduce thermos-acoustic noise can be utilized separately or in conjunction with one another. For example, in some embodiments, one or more of the features described above with respect to FIGS. 1-14 can be utilized in conjunction with one or more of the features described below with respect to FIGS. 15-18.

Figure 15:
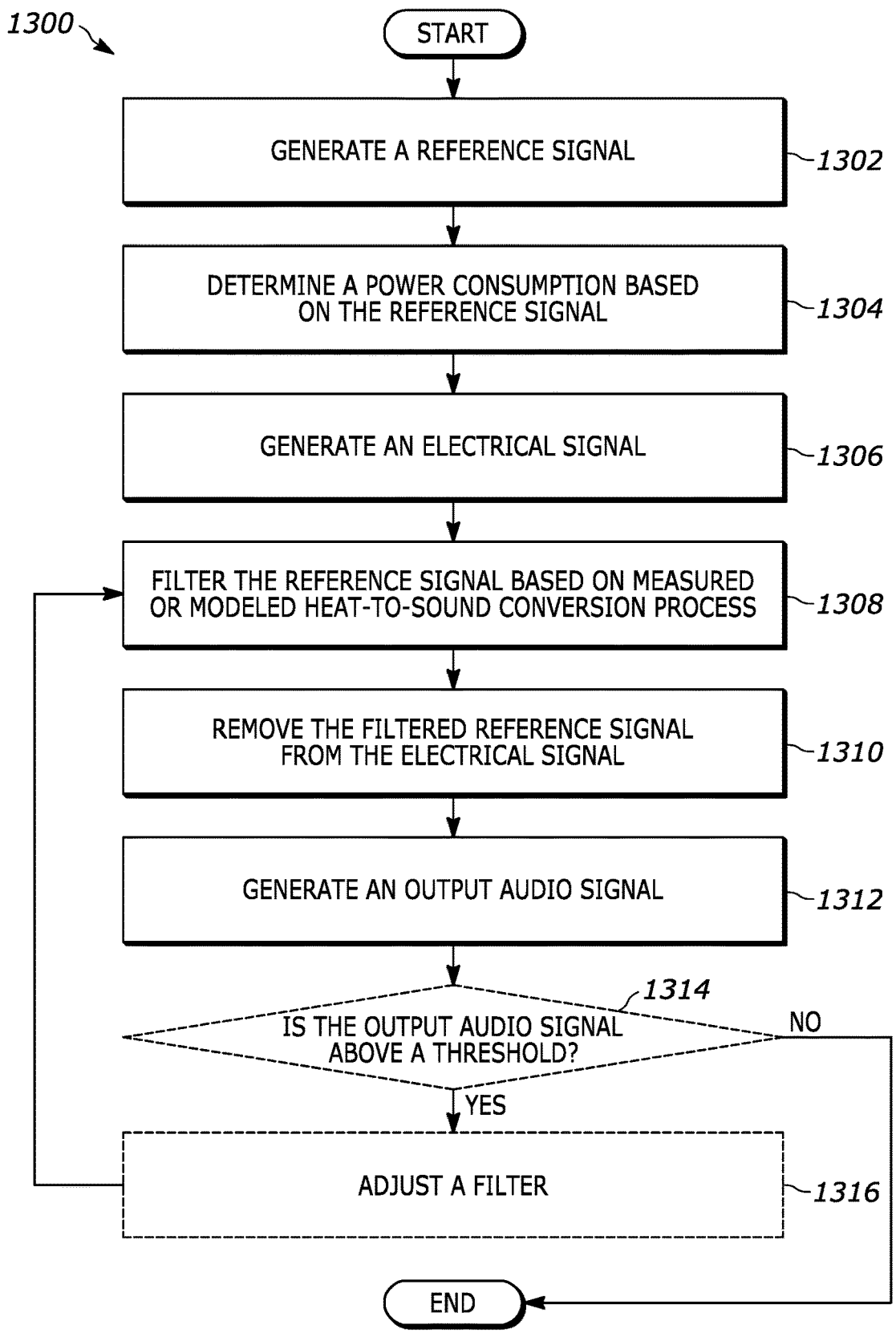
FIG. 15 is a flow diagram of a method of reducing noise in a microphone device, according to an illustrative embodiment.

FIG. 15 depicts a flow diagram of a first example method, shown as method 1300 of reducing thermo-acoustic noise in a microphone device. In alternative embodiments, the method 1300 may include additional, fewer, and/or different operations. In various example embodiments, the method 1300 may be implemented using the microphone device 100 described with reference to FIG. 1. Alternatively, the method 1300 may be implemented on a microphone device including a MEMS transducer 104 and an IC 106 that are disposed within the same enclosed volume (e.g., a microphone device without a wall that separates the MEMS transducer 104 from the IC 106). At 1302, a reference signal associated with the operation of the IC 106 is measured (e.g., using a sensor, such as a temperature sensor, resistor, etc.). Block 1302 may include sensing a condition of the microphone device, such as identifying operations that result in a large amount of heat generation (e.g., processing intensive operations) by the IC 106. For example, block 1302 may include measuring a current passing through the IC 106 using a sensing resistor or another current measurement device. In another example, block 1302 may include measuring a temperature of the IC 106 directly using a temperature sensor disposed on the IC 106 (e.g., on at least one of the ASIC 124 or the DSP 126). In yet another example, block 1302 may include determining a command executed by the IC 106 (e.g., an add command, a multiply command, a move memory command, etc.).

At 1304, a power consumption of the IC 106 is determined based on the reference signal. Block 1304 may include determining a power consumption of the IC 106 based on the current. The power consumption may be determined by a processor of the IC 106 by multiplying the current by a known voltage across the IC 106 (e.g., a regulated voltage across the IC 106, etc.). Alternatively, the power consumption may be determined using one, or a combination of circuit elements structured to multiply the current by a predefined value (e.g., a predefined operating voltage of the IC 106, etc.). In embodiments where a command is sensed or otherwise determined, block 1304 may include determining a filtered reference signal based on a modeled current draw of the IC 106 or based on test results from an actual microphone device. The method 1300 may include determining a property of noise generated by the IC 106 based on the reference signal based on measured or modeled data. The property may be one of a magnitude and frequency of the noise; for example, the method 1300 may include crawling through a list of measured properties or modeled properties to determine the property corresponding to the reference signal.

At 1306, an electrical signal is generated by the MEMS transducer 104. The electrical signal may be generated based on a change in capacitance of the MEMS transducer 104 in response to acoustic energy (e.g., pressure fluctuations) incident on the MEMS transducer 104. The electrical signal may include thermo-acoustic noise generated by the IC 106 as well as sound (e.g., pressure fluctuations) transmitted to the MEMS transducer 104 through the port 128. At 1308, the reference signal is filtered based on a measured or modeled heat-to-sound conversion process. Block 1308 may include passing the reference signal (e.g., the power consumption, a temperature of the IC 106, and/or sensed commands executed by the IC 106) through an infinite impulse response (IIR) filter to obtain a filtered reference signal. In some embodiments, the IIR filter may be implemented as plurality of cascaded biquadratic filters (biquads). The biquads may be structured to scale the reference signal to match a level of thermo-acoustic noise corresponding to the reference signal. In other embodiments, block 1308 includes digitizing the reference signal (e.g., via an analog-to-digital converter) and digitally filtering the digitized signal via the DSP 126. Among other benefits, digital filtering may be faster to implement than analog filtering, albeit with a small reduction in overall processing power provided by the DSP 126.

In some embodiments, the reference signal may be conditioned prior to filtering. For example, the IC 106 may include a reference signal generator that conditions the reference signal received from the sensor and generates a conditioned reference signal. In some such embodiments, the reference signal generator may include one or more transistors. The reference signal generator may capture the reference signal from the sensor, buffer it, and adjust it to be a suitable size voltage to be presented to the filter. For example, the sensor output could be too weak to be presented directly to the filter. In some implementations, the sensor may be a temperature sensor including a semiconductor junction having a current flow that is substantially temperature dependent. The reference signal generator may convert the voltage and amplify it. In the case of a current sensor, a small resistor could be connected to the power input pin of the die so that the current consumed by the die would flow through the resistor. The resistor could have a low resistance value to reduce the total power loss, and in turn would have a small voltage drop. The voltage drop across the resistor could be sensed by subtracting the voltages at the two ends of the resistor, and the reference signal generator could amplify the sensed voltage to a suitable voltage to be sent to the filter.

Figure 16:
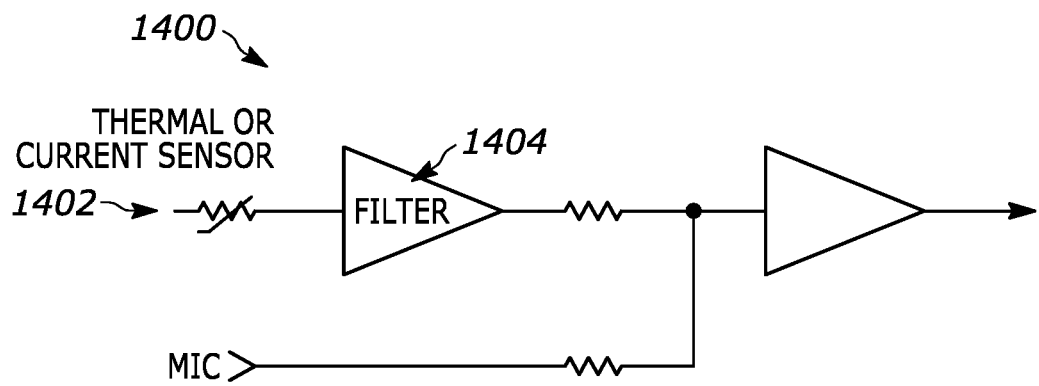
FIG. 16 is a circuit schematic of an analog circuit used to reduce noise in a microphone device, according to an illustrative embodiment.

At 1310, the filtered reference signal is removed from the electrical signal output from the MEMS transducer 104. Block 1310 may include subtracting the filtered reference signal from the electrical signal in order to reduce thermo-acoustic noise in the output audio signal. FIG. 16 depicts an analog feedforward noise cancelation circuit, shown as circuit 1400. The circuit 1400 includes a sensor 1402, a filter 1404, and a MEMS transducer 104. The sensor 1402 may include a temperature sensor configured to measure a temperature of the IC 106 (e.g., at least one of the ASIC 124 or the DSP 126). The temperature sensor may be integrated into the IC 106 or bolted onto an outer surface of the IC 106. In various illustrative embodiments, the temperature sensor may include a transistor within the DSP 126 or ASIC 124 that is sensitive to current fluctuations through at least one of the DSP 126 or ASIC 124. In some embodiments, the sensor may include a current sensor configured to measure an electrical current passing through the IC 106. The current sensor may include a sensing resistor electrically connected to the IC 106. In some implementations, the circuit 1400 could also include a reference signal generator positioned between the sensor 1402 and the filter 1404 and configured to condition the reference signal received from the sensor 1402 before transmitting the conditioned reference signal to the filter 1404, as described in further detail above.

The filter 1404 may be an analog or digital filter structured to scale the reference signal based on the heat-to-sound conversion process. As shown in FIG. 16, an input to the filter 1404 is electrically connected to the sensor 1402. An output from the filter 1404 is electrically subtracted from an output from the MEMS transducer 104. In alternative embodiments, the circuit 1400 may include additional, fewer, and/or different components.

Figure 17:
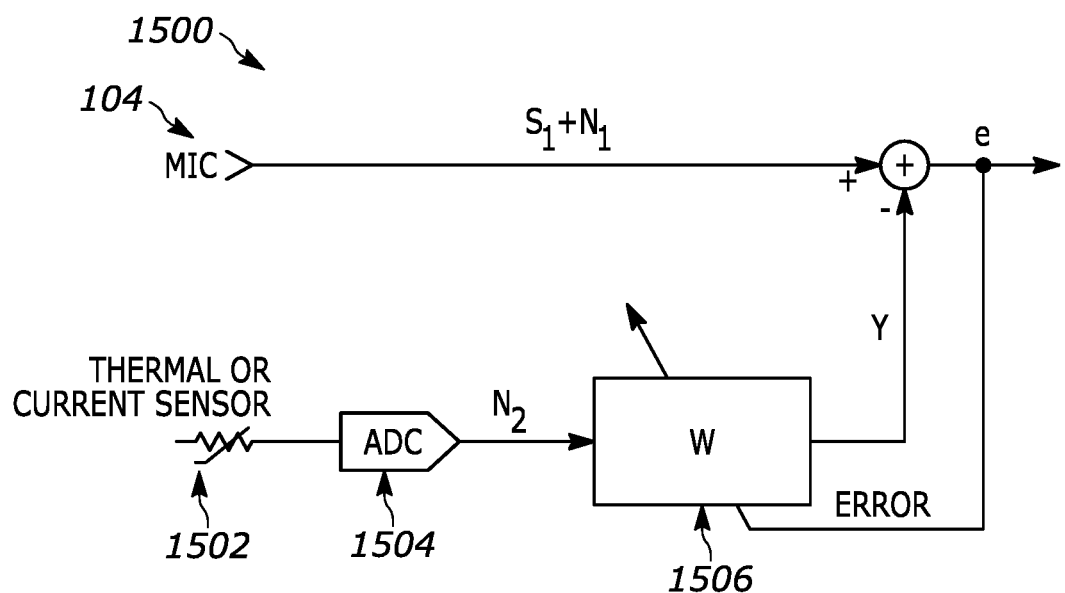
FIG. 17 is a block diagram of a digital feedforward noise cancelation system for a microphone device, according to an illustrative embodiment.

FIG. 17 depicts a digital feedforward noise cancelation system, shown as system 1500. The system 1500 may utilize the DSP 126 to accomplish, perform, or otherwise implement various actions described with reference to the method 1300 of FIG. 15. As shown in FIG. 17, the system 1500 includes a sensor 1502, an analog-to-digital converter (ADC) 1504, a MEMS transducer 104, and a digital filter 1506. The sensor 1502 may be the same as or similar to the sensor 1402 of FIG. 16. The ADC 1504 provides a digitized signal to the digital filter 1506. An input to the ADC 1504 is electrically connected to the sensor 1502. While the ADC 1504 is shown as digitizing the signal from the sensor 1502, in some embodiments, it may also digitize the signal from the MEMS transducer 104. In other embodiments, separate ADCs may be provided to digitize the signals from the sensor 1502 and the MEMS transducer 104. An output to the ADC 1504 is electrically coupled to the digital filter 1506. The digital filter 1506 is configured to form a prediction of noise created by the integrated circuit by adjusting the level and phase of signal components presented to the integrated circuit based on the heat-to-sound conversion process. An output from the digital filter 1506 is electrically subtracted from an output from the MEMS transducer 104. In some implementations, the circuit 1500 could include a reference signal generator positioned between the sensor 1502 and the filter 1506 and configured to condition the reference signal received from the sensor 1502 before transmitting the conditioned reference signal to the filter 1506, as described in further detail above. In some embodiments, the ADC 1504 may be a part of the reference signal generator or may be a separate element.

In various illustrative embodiments, the filter 1404 of FIG. 16 or the digital filter 1506 of FIG. 17 may be a finite impulse response (FIR) filter. In the embodiment of FIG. 17, the FIR filter may be incorporated into the DSP 126.

The example method 1300 of FIG. 15 includes adaptively filtering the reference signal to minimize a level of the output signal in a microphone device, such as the microphone device 100 of FIG. 1. At 1312, the output audio signal from the microphone device 100 (e.g., the IC 106) is generated. Block 1312 may additionally include determining an amplitude (e.g., magnitude) of the output audio signal. At 1314, the output audio signal is compared to a predefined threshold, in some implementations. In some embodiments, block 1314 may include comparing a real-time output audio signal (e.g., the magnitude of the real-time output audio signal) with a previously determined (e.g., measured) output audio signal. In the event that the real-time output audio signal exceeds the predefined threshold, the method 1300 proceeds to block 1316 and the filter is adjusted to reduce a level of the output signal (e.g., reduce a level of the output correlating to the buzz noise, as the only portion of the audio signal correlated to the reference signal is the buzz noise). In some implementations, method 1300 may proceed to block 1316 without performing block 1314, such that the filter is altered regardless of whether the output signal is greater than a threshold.

At 1316, a filter is adjusted. Block 1316 may include adjusting a multiplier of the filter to scale the filter up or down in response to a trend of the output audio signal between a previous value and a real-time value. Block 1316 may be performed manually (e.g., at the end of a manufacturing operation for the microphone device 100) or automatically by the DSP 126. After the filter is adjusted, the method 1300 returns to block 1308. In some embodiments, the method 1300 repeats blocks 1308 through 1316 continuously in order to minimize the output audio signal. In other embodiments, as shown in FIG. 15, the method 1300 proceeds until the output audio signal is below the predefined threshold (e.g., a threshold established based on a test of the microphone device at the end of a manufacturing operation, based on a standard output audio threshold baseline, etc.). In some embodiments, the gain at the end of the filter may be adjusted. In some embodiments, the levels of various component parameters of the filter (e.g., FIR taps) may be adjusted. It should be understood that the adaptive filter adjustment of blocks 1314 and 1316 is optional and, in some implementations, a fixed filter that is not adapted could be used (e.g., trading less cancellation for lower MIPS and program memory). In various implementations, the filter may be adjusted periodically or continuously. It should be understood that any type of filter could be used, such as IIR, FIR, analog, or various other types of filters.

Figure 18:
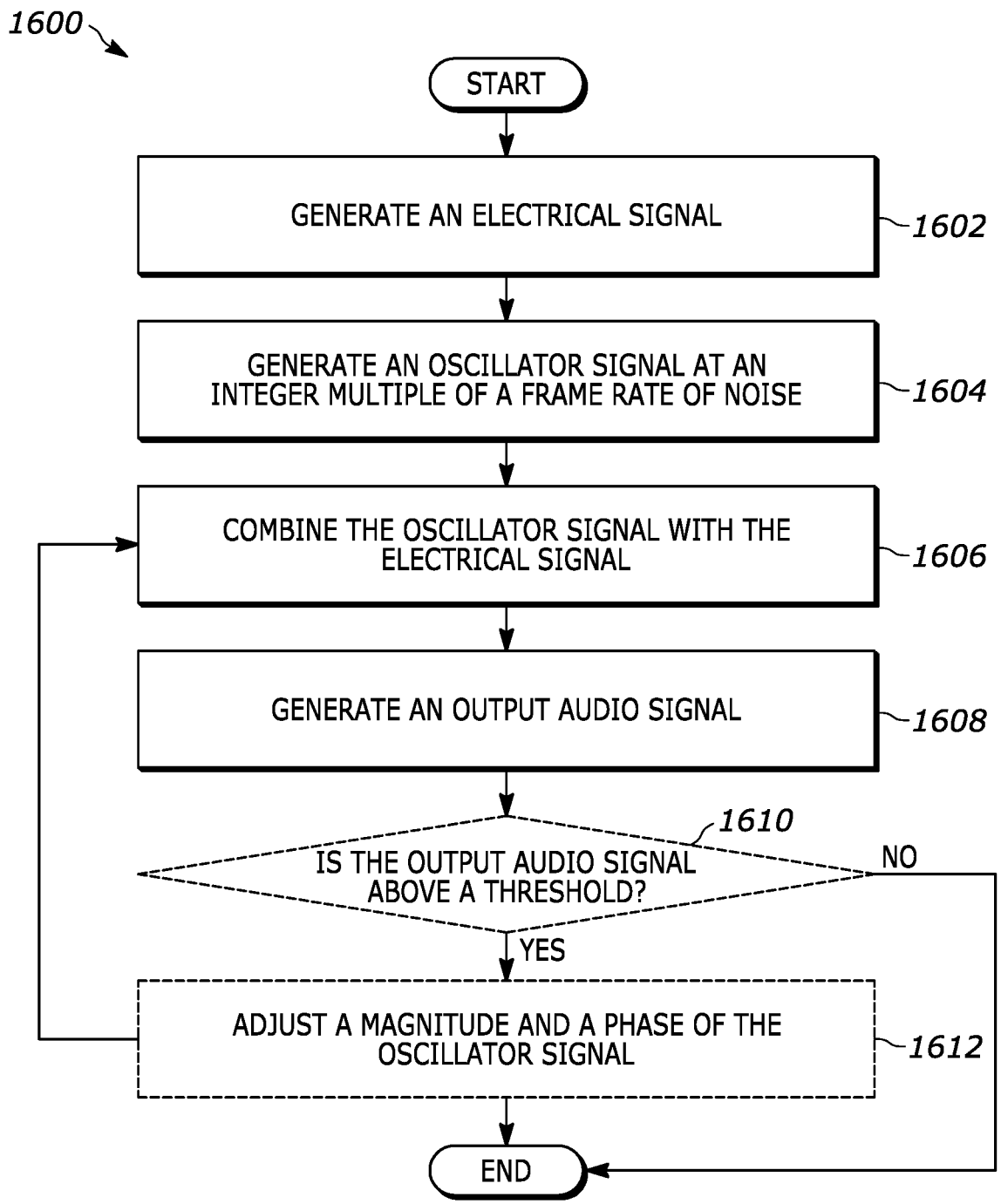
FIG. 18 is a flow diagram of a method of reducing noise in a microphone device, according to another illustrative embodiment.

FIG. 18 depicts a flow diagram of a second example method, shown as method 1600 of reducing thermo-acoustic noise in a microphone device (e.g., microphone device 100). In alternative embodiments, the method 1600 may include additional, fewer, and/or different operations. At 1602, an electrical signal is generated by the MEMS transducer 104. Block 1602 may be the same or similar to block 1306 of method 1300 (see also FIG. 15). At 1604, an oscillator signal is generated at an integer multiple of a frame rate of thermo-acoustic noise. The oscillator signal may be generated by a sinusoidal oscillator. In some embodiments, the microphone device 100 includes a plurality of sinusoidal oscillators in which each oscillator is tuned to a different integer multiple of the frame rate. In an example embodiment, the frame rate may be determined at least semi-empirically based on a measured or modeled thermo-acoustic noise in the microphone device 100. Block 1604 may include adapting a magnitude and a phase (e.g., frequency) of each one of the sinusoidal oscillators in order to match an integer multiple of the frame rate.

At 1606, the oscillator signal generated by the sinusoidal oscillator is combined with the electrical signal output from the MEMS transducer 104. In the example embodiment of FIG. 18, the method 1600 additionally includes optional operations to minimize noise in the output audio signal. Blocks 1608 and 1610 may be the same or similar to blocks 1312 and 1314, respectively of the first example method 1300 of FIG. 15. At 1608, an output audio signal is generated by the microphone device 100 based on the combination of the oscillator signal and the electrical signal. At 1610, the IC 106 compares the output audio signal with a threshold value (e.g., a predefined threshold, a known output magnitude based on a standard output audio baseline, etc.). In some embodiments, block 1610 includes comparing a real-time output audio signal with a previous value of the output audio signal. In the event the audio signal exceeds the threshold, a characteristic regarding the oscillator is adjusted. The characteristic may be a magnitude and/or a phase of the oscillator signal. Method 1600 includes repeating blocks 1606 through 1612 to minimize the output audio signal (e.g., to minimize thermo-acoustic noise in the output signal). In other embodiments, as shown in FIG. 18, the method 1600 proceeds until the output audio signal is below the predefined threshold (e.g., a threshold established based on a test of the microphone device at the end of a manufacturing operation, based on a standard output audio threshold baseline, etc.). As with blocks 1314 and 1316 of FIG. 15, it should be understood that blocks 1610 and 1612 are optional and, in some embodiments, the adjustment steps of blocks 1610 and 1612 may not be included.

The microphone device, of which various illustrative embodiments are disclosed herein, provides several advantages over microphones that include a MEMS transducer and an IC within the same enclosed volume. In one or more example embodiments, the microphone device includes a wall that separates and acoustically isolates the MEMS transducer from the IC. The wall and air pocket above the IC insulate the IC, thereby reducing heat transfer to the air pocket above the MEMS transducer. In some embodiments, the air pocket above the IC is fluidly connected to an environment surrounding the microphone device (e.g., via a vent in the cover, etc.), which, advantageously, allows for expansion and contraction of the air above the IC at approximately constant pressure. The microphone device may additionally implement a feedforward noise cancelation technique or filtering technique to reduce the noise in the output audio signal, which may be implemented without modifying the enclosed-back volume surrounding the MEMS transducer.

A first aspect of the present disclosure relates to a microphone device. The microphone device includes a housing including a partition separating an interior of the housing into a first cavity and a second cavity, the housing having an external interface with electrical contacts. The microphone device further includes an electro-acoustic microelectromechanical systems (MEMS) transducer disposed in the first cavity of the housing and an integrated circuit disposed in the second cavity of the housing and electrically coupled to the MEMS transducer and to the electrical contacts of the external interface. The partition insulates the MEMS transducer in the first cavity from temperature-induced pressure changes generated by the integrated circuit in the second cavity.

Another embodiment relates to a microphone device including a housing including an interior having a first volume and a second volume thermally isolated from the first volume, the housing including a thermal vent between the second volume and an exterior of the housing, and an external interface with electrical contacts. The device further includes an electro-acoustic microelectromechanical systems (MEMS) transducer disposed in the first volume of the housing and an integrated circuit disposed in the second volume of the housing and electrically coupled to the MEMS transducer and to electrical contacts of the external interface. The MEMS transducer in the first volume is insulated from temperature-induced pressure changes generated by the integrated circuit in the second volume.

Another embodiment relates to a microphone device including a housing including a substrate including an external interface with electrical contacts, a first cover portion mounted on the substrate forming a first volume, and a second cover portion mounted in the substrate forming a second volume, the first volume thermally isolated from the second volume. The microphone device further includes an electro-acoustic microelectromechanical systems (MEMS) transducer disposed in the first volume of the housing and an integrated circuit disposed in the second volume of the housing and electrically coupled to the MEMS transducer and to electrical contacts of the external interface. The MEMS transducer in the first volume is insulated from temperature-induced pressure changes generated by the integrated circuit in the second volume.

Another embodiment relates to a microphone device including a housing having an external device interface with electrical contacts, a microelectromechanical systems (MEMS) transducer disposed in the housing and configured to generate an electrical signal in response to detecting changes in pressure, a sensor disposed in the housing and configured to sense a condition within the housing, and an integrated circuit disposed in the housing and electrically coupled to the MEMS transducer, an output of the sensor and to contacts of the external interface. The electrical circuit includes a reference signal generator configured to generate an electrical reference signal based on the sensed condition, a filter configured to filter the reference signal, and a difference circuit configured to remove the filtered reference signal from the electrical signal. The microphone assembly outputs a signal based on the electrical signal after removal of the filtered reference signal.

Another embodiment relates to a method of reducing noise in a microphone device. The microphone device includes a MEMS transducer and an integrated circuit electrically coupled to the MEMS transducer disposed in a partially enclosed housing. The method includes generating a reference signal based on a condition within the housing. The method additionally includes filtering the reference signal based on a heat-to-sound conversion process using a filter of the integrated circuit to obtain a filtered reference signal and generating an electrical signal based on change in pressure using the MEMS transducer. The method further includes removing the filtered reference signal from the electrical signal to generate an output signal.

Another embodiment relates to a method of reducing noise in a microphone device. The microphone device includes a MEMS transducer and an electrical oscillator. The method includes generating, by the MEMS transducer, an electrical signal. The method additionally includes generating, by the electrical oscillator, an oscillator signal whose frequency is an integer multiple of a frame rate of noise generated by an integrated circuit. The method further includes combining the oscillator signal with the electrical signal to generate an output signal.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone device comprising:
   a housing having an external device interface with electrical contacts;
   a microelectromechanical systems (MEMS) transducer disposed in the housing and configured to generate an electrical signal in response to detecting changes in pressure;
   a sensor disposed in the housing and configured to sense a condition within the housing and generate a reference signal based on the condition; and
   an integrated circuit disposed in the housing and electrically coupled to the MEMS transducer, an output of the sensor and to contacts of the external interface, the integrated circuit comprising:
   a filter configured to filter the reference signal; and
   a difference circuit configured to remove the filtered reference signal from the electrical signal,
   wherein the microphone assembly outputs a signal based on the electrical signal after removal of the filtered reference signal.

2. The device of claim 1, wherein the sensor is a resistor coupled to a supply input of the integrated circuit, wherein the reference signal generator is configured to generate the electrical reference signal based on a current through the resistor.

3. The device of claim 1, wherein the sensor is a temperature sensor coupled to integrated circuit, and wherein the reference signal generator is configured to generate the electrical reference signal based on a temperature sensed by the temperature sensor.

4. The device of claim 1, wherein the filter comprises a plurality of biquadratic filters.

5. The device of claim 4, wherein the integrated circuit includes one or more analog-to-digital converters (ADCs) coupled to an output of the MEMS transducer and to an output of the sensor, the one or more ADCs configured to digitize the electrical signal and the reference signal, wherein the filter comprises a finite impulse response (FIR) filter.

6. The device of claim 1, wherein the integrated circuit further comprises a reference signal generator configured to condition the reference signal received from the sensor to generate a conditioned reference signal, wherein the filter is configured to filter the conditioned reference signal.

7. The device of claim 1, wherein the filter filters the reference signal based on a heat-to-sound conversion process to obtain the filtered reference signal.

8. A method in a microphone device, the method comprising:
   generating an electrical signal in response to detecting a change in pressure using a microelectromechanical systems (MEMS) transducer disposed in a housing;
   sensing a condition within the housing by using a sensor disposed in the housing;
   generating a reference signal based on the sensed condition;
   filtering the reference signal;
   removing the filtered reference signal from the electrical signal; and
   outputting a signal based on the electrical signal after removal of the filtered reference signal.

9. The method of claim 8, wherein filtering the reference signal comprises filtering the reference signal based on a heat-to-sound conversion process using a filter to obtain a filtered reference signal.

10. The method of claim 8,
    wherein sensing a condition comprises measuring a current through an integrated circuit using a sensing resistor, and
    wherein the method comprises determining a power consumption of the integrated circuit based on the current.

11. The method of claim 8, wherein sensing a condition comprises measuring a temperature using a temperature sensor mounted to at least one of an application specific integrated circuit (ASIC) or a digital signal processor (DSP).

12. The method of claim 8, further comprising:
    detecting a command from an integrated circuit; and
    determining a power consumption of the integrated circuit based on the command.

13. The method of claim 8, wherein filtering the reference signal comprises filtering the reference signal using a plurality of biquadratic filters.

14. The method of claim 8, wherein filtering the reference signal comprises determining a property of noise generated by the integrated circuit based on the reference signal, wherein the property is one of a magnitude and a frequency of the noise.

15. The method of claim 14, wherein determining the property comprises crawling through a list of measured properties or modeled properties to determine the property corresponding to the reference signal.

16. The method of claim 8,
wherein filtering the reference signal comprises filtering the reference signal using a finite impulse response (FIR) filter, and
wherein the method further comprises:
passing the reference signal as an input to the FIR filter; and
subtracting an output from the FIR filter from the electrical signal.

17. The method of claim 8, further comprising:
generating an output signal;
comparing a magnitude of the output signal to a threshold value; and
adjusting a filter level for filtering the reference signal.

18. The method of claim 17,
wherein filtering the reference signal comprises filtering the reference signal using a finite impulse response (FIR) filter, and
wherein adjusting the filter level comprises adjusting a multiplier of the FIR filter to scale the FIR filter up or down.

19. The method of claim 8, further comprising digitizing the electrical signal and the reference signal by using one or more analog-to-digital converters (ADCs) coupled to an output of the MEMS transducer,
wherein filtering the reference signal comprises filtering the reference signal using a finite impulse response (FIR) filter.

20. The method of claim 8, further comprising conditioning the reference signal received from the sensor to generate a conditioned reference signal,
wherein filtering the reference signal comprises filtering the conditioned reference signal to generate the filtered reference signal.

\* \* \* \* \*